Aug. 1, 1961 E. H. McLAUGHLIN 2,994,806

ELECTRONIC CIRCUIT COMPONENT HOLDER

Filed Dec. 27, 1949

EDGAR H. McLAUGHLIN
INVENTOR

BY [signature]

ATTORNEYS

United States Patent Office 2,994,806

Patented Aug. 1, 1961

2,994,806

ELECTRONIC CIRCUIT COMPONENT HOLDER

Edgar H. McLaughlin, Rochester, N.Y., assignor, by mesne assignments, to the United States of America as represented by the Secretary of the Navy Filed Dec. 27, 1949, Ser. No. 135,063
4 Claims. (Cl. 317—99)

This invention relates to the manufacture of electrical equipment, and in particular to simplification in the production of small, compact electronic circuit assemblies that must withstand severe impact, vibration, moisture and thermal shock tests.

In commercial electronic equipment the electrical leads which are not particularly susceptible to hum are frequently run "haywire," and whenever possible components with pigtail leads, such as insulated resistors, coils and capacitors are wired directly into the circuits and soldered to terminal strips or tube sockets so as to be self-supporting. Design considerations are more complex in small, compact electronic circuit assemblies, such as amplifiers for electrically actuated projectile fuzes, that must be able to withstand severe impact and vibration and still perform satisfactorily over a wide temperature range and under extreme humidity conditions. Subminiature type radio tubes constructed with pigtail leads are often wired directly into such electronic circuits so as to be self supporting, and the assemblies are potted with insulating material to provide maximum weather-proofing and to prevent displacement of the components when an ordnance projectile containing the assembly is fired. The word "potting" as used hereinafter in the specification is intended to include the operation of pouring or injecting softened insulating material into a container or cavity of suitable shape into which a wired electronic circuit assembly has been inserted so that upon solidification the insulating material fills all the voids and spaces between the components and completely surrounds the assembly.

None of the methods heretofore utilized to support electronic circuit components during the potting operation permitted efficient wiring and assembly techniques. Short, direct wiring connections were seldom possible. The long leads resulted in high lead inductance and loose or broken connections and necessitated the use of insulating tubing, or "spaghetti," over most of the pigtail leads. It was necessary to preform most of the electrical leads, thereby greatly increasing assembly time. To prevent shorting between solder joints on adjacent leads, the soldering had to be performed on staggered levels, which made wiring complex and time consuming.

Such electronic circuit assemblies were heretofore potted with wax, which softens at temperatures approaching 120° F. and cracks at temperature approaching −40° F. This is not a sufficient range of temperature to prevent softening of the potting wax during the firing of an ordnance projectile. Consequently, the components were frequently displaced downward under the force of inertia or setback and smashed against the plate upon which the electronic assembly was mounted. The soldered pigtail leads, which provided the only support for the components of electronic circuit assemblies heretofore manufactured, were not sufficiently strong to permit potting by injection techniques with higher melting point insulating materials. Electronic components can safely withstand only a given maximum temperature, and higher melting point insulating materials were too viscous at this maximum temperature to allow injection potting without displacement of the components and breakage of leads. Furthermore, it was impossible to pot the assemblies with wax by pouring techniques without the formation of voids. If a component was supported above a void, upon setback the component was displaced downward into the void, which often resulted in broken electrical connections.

It is an object of the invention to provide means of supporting the components of an electronic circuit whereby the assembly will be of minimum size and weight and yet can be assembled and wired in a minimum of time. A further object is to provide such improved means of supporting electronic components whereby only minimum lengths of leads are required so that the wiring can be as short and direct as possible to minimize lead inductance. A still further object is to provide means of supporting components of an electronic assembly whereby the components have a fixed position in the assembly to allow standardization of wiring and the use of wiring diagrams in production. It is a still further object of the invention to provide such improved means of supporting electronic components whereby all the connections at the top of the electronic circuit assembly are soldered at the same level, all of the connections at the bottom of the assembly are soldered at the same level, and the pigtail leads of the components are enclosed in insulating material as far as these soldering levels, thus eliminating the use of spaghetti on most of the leads, minimizing the number of leads that must be preformed, and avoiding the necessity of staggering the levels at which soldering is performed as was heretofore necessary to avoid short circuits between solder joints. Another object of the invention is to provide means of supporting the components of an electronic circuit which will insulate the components from each other along their entire length to allow the use of condensers hermetically sealed within metal cans as part of the assembly without danger of short circuiting between the metal cans and other parts of the circuit.

It is a still further object of the invention to provide improved means of supporting electronic components by means other than the pigtail leads of the components to produce an assembly of rugged construction and dependable electrical characteristics. Another object is to provide means of supporting electronic circuit components with sufficient strength so that it is no longer necessary to pot the electronic circuit assembly by pouring methods, and injection techniques utilizing insulating materials that are more viscous than wax at the maximum temperature to which the components can be safely subjected can be utilized to pot the assembly. The use of injection potting squeezes the voids down to a minimum size, which prevents lead breakage due to displacement of the components into the voids as was frequently encountered in wax-potted assemblies. It is thus a still further object of the invention to provide improved means of supporting the components of small, compact electronic assemblies which will provide maximum resistance to impact and vibration.

These and other objects are attained by assembling resistors, condensers, subminiature type radio tubes, chokes, rectifiers and other approximately cylindrical, pigtail-lead components within a one-piece, molded, plastic casing honeycombed with a plurality of parallel, substantially cylindrical, vertical component holding pockets. The pockets are open at the top and circular rather than hexagonal in horizontal cross section with the diameter of the pockets corresponding to the diameter of the components. An inwardly extending shoulder adapted to support a component thereon and to fit the end of the component extends transversely of but only partially across the lower end of each pocket to form the bottom wall thereof. It is intended that "shoulder" as used in the specification and in the appended claims include a radial flange or rim extending transversely of a pocket completely around the periphery thereof, a radial flange or rim extending transversely of but only partially around the periphery of a pocket, as well as a flange or rim formed where a pocket gradually narrows in diameter in such a manner that the bottom of the pocket is contoured to receive a subminiature type radio tube. The opening through the bottom wall of a pocket is of sufficient size to allow a pigtail lead from a component to extend therethrough. Connections between pigtail leads, which pass through the opening in the bottom wall of the pockets and protrude below the plastic casing, can thus be soldered at the level of the bottom surface of the casing. Small diameter vertical apertures are provided through the casing to allow the passage of wires through the electronic circuit assembly without making electrical connection thereto.

Figure 1:
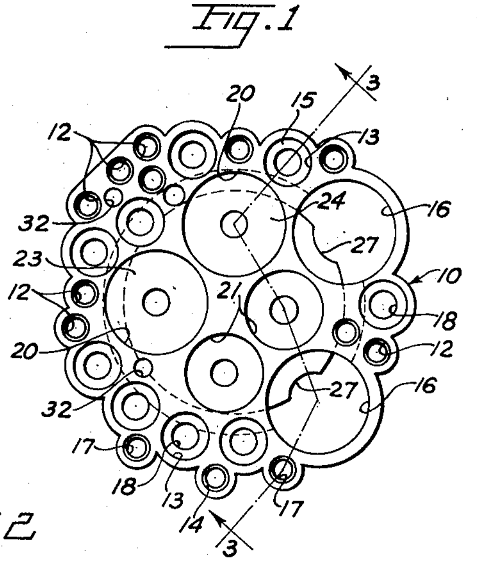
FIG. 1 is a top view of a one-piece, molded plastic component holder embodying the invention.
Figure 2:
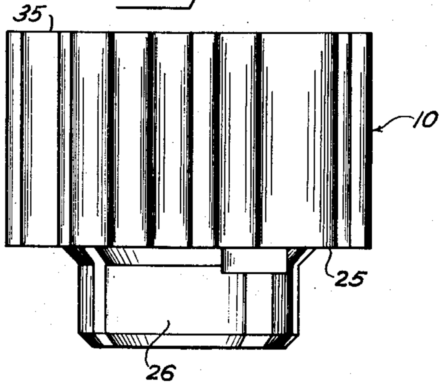
FIG. 2 is a front view of the component holder of FIG. 1.
Figure 3:
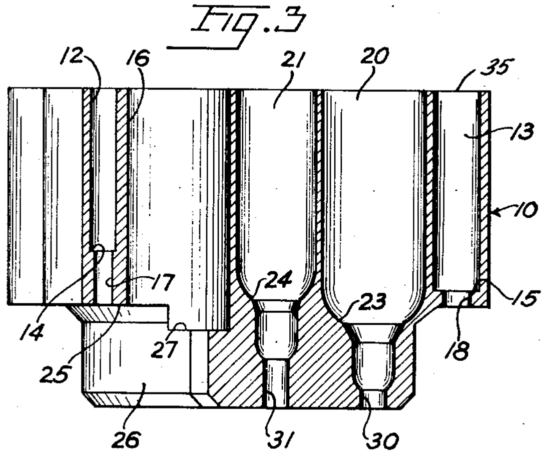
FIG. 3 is a vertical sectional view taken on line 3—3 of FIG. 1.

In the preferred embodiment of the invention illustrated in the drawings, a component holder casing 10 molded of a suitable insulating material, such as polyethylene, having high impact strength and a sufficiently high melting point to prevent softening at the temperature encountered in injection potting an electronic circuit assembly, is honeycombed with a plurality of parallel, substantially cylindrical, vertical component holding pockets. In order to provide a snug fit for electronic circuit components, each component holding the pocket is made circular rather than hexagonal in horizontal cross section with a slightly smaller diameter than the approximately cylindrical resistor, condenser, radio tube, choke, rectifier or other component to be inserted therein. It is desirable that the plastic of which the casing 10 is molded possess sufficient elasticity to deform when a component is inserted into a pocket and to "spring back" against the component so that considerable tension on the pigtail leads is required to remove a component from the casing 10.

A plurality of small diameter, vertical, component holding pockets 12 are molded in the casing 10 near the outer periphery thereof to receive one-half watt, insulated, axial-lead resistors, and a plurality of slightly larger diameter, vertical, component holding pockets 13 are also provided near the outer periphery to receive cylindrical resistors of larger wattage, choke coils, rectifiers and capacitors. Radial shoulders 14 and 15 extending inwardly around the entire periphery but only partially across the lower end of the component holding pockets 12 and 13 are adapted to support cylindrical electronic circuit components thereon. The radial shoulders 14 and 15 form the bottom wall of the pockets 12 and 13 respectively. The vertical, cylindrical central apertures 17 and 18 through the bottom wall of the pockets 12 and 13 respectively are of sufficient diameter to allow a pigtail lead of a component to extend therethrough and protrude below the bottom surface 25 of the casing 10. Two vertical, cylindrical pockets 16 of larger diameter are provided through the casing 10 near the outer periphery thereof to receive condensers hermetically sealed within metallic cans, and a radial shoulder 27 covering less than 360° of a circle is provided to support these condensers. Subminiature type radio tubes can be conveniently supported within two pairs of vertical, component holding pockets 20 and 21 provided in the central portion of the casing 10. Shoulders 23 and 24 extending inwardly around the entire periphery but only partially across the lower end of the pockets 20 and 21 respectively form the bottom wall thereof. The pockets 20 and 21 narrow gradually in diameter at the shoulders 23 and 24 respectively in such a manner that the bottom of the pockets 20 and 21 is contoured to receive subminiature type radio tubes. Vertical central apertures 30 and 31 are provided through the bottom wall of the pockets 20 and 21 respectively at the shoulders 23 and 24. Small diameter vertical apertures 32 are provided through the casing 10 to allow the passage of electrical leads through the electronic circuit assembly without making electrical connection thereto.

It will be readily observed that the electronic circuit components are not supported solely by soldered pigtail leads, but are seated against the shoulders 14, 15, 23, 24 and 27 and are further held in place by the elasticity of the plastic of the casing 10. Soldering between pigtail leads of the components is performed at the levels of the upper and lower surfaces 35 and 25 respectively of the casing 10. It is apparent that the leads of resistors, capacitors or other axial-lead electronic components mounted within the pockets will be encircled by the plastic of the casing as far as the levels 35 and 25 where the soldering is performed, thus eliminating the use of spaghetti on many of the leads. Soldering of all pigtail leads at the same level permits short direct connections with minimum lead inductance, eliminates the necessity of staggering the levels at which the solder joints are formed as was encountered in assembly techniques heretofore utilized, and obviates the necessity of performing the pigtail leads. Each electronic component has a fixed place in the assembly, thus allowing standardization of wiring and the use of wiring diagrams on a production basis. The electronic circuit components are all maintained parallel within the smallest possible volume, the insulating material of the casing 10 occupying only a slightly greater volume than the air spaces between a bundle of the same components. The components within the pockets are insulated from each other along the entire depth of the pockets by the plastic of the casing 10 which allows the use within the pockets 16 of condensers hermetically sealed in metal cans with little danger of shorting between the metal cans and other parts of the electronic circuit. An assembly has thus been provided which occupies a minimum of space, but which requires only a minimum of assembly and wiring time because of elimination of spaghetti on the leads, because of reduction in the number of leads that have to be preformed, and because of simplification and standardization of wiring and soldering.

The component holder of the invention is especially adapted for use in supporting the components of electronic circuit assemblies for electrically actuated projectile fuzes. To perform satisfactorily in the high humidity of tropical climates and at the temperatures encountered within a fuze during the firing of a projectile, the assemblies must be potted with insulating material. As disclosed in the application of John W. Kyle, Serial No. 199,038, filed December 4, 1950 the component holder casing 10 can be conveniently inserted into a cup-shaped container (not shown) with the base 26 fitting within a recess formed in the bottom wall of the container. External connections can be conveniently made to the electronic circuit assembly if insulated eyelets are fastened to the bottom wall of the container so that they protrude therethrough. If the eyelets are disposed around the recess beneath the component holding pockets 12, 13 and 16, the pigtail leads from the components can be soldered directly to the eyelets.

Many such electronic assemblies were heretofore potted with wax after a suitable cover had been placed upon the container. However, as described hereinbefore, softening of the wax when a projectile was fired often caused the components to be displaced downward upon setback and resulted in broken or loosened electrical leads. Many electronic components cannot safely withstand temperatures above 250° F. At this temperature it was heretofore impossible to pot the electronic assemblies with higher melting point insulating materials by injection techniques because the insulating materials were not sufficiently fluid at this temperature to prevent damage to the assemblies. The components were only held in place by soldered pigtail leads, which did not afford sufficient strength to withstand the pressure of the injected insulating material in the semi-solid state without displacement of the components. In the component holder of the invention, the components are seated against the shoulders 14, 15, 23, 24 and 27 which provide greater support for the components than soldered pigtail leads. It is thus possible to utilize potting materials that are much less fluid than wax at the maximum temperature to which the components can be safely subjected. With a suitable plastic, such as polyethylene, a potted electronic circuit assembly will perform satisfactorily at temperatures from −60° F. to 165° F., and such assemblies can be repeatedly heated to 165° F. and then cooled to −60° F. without deterioration of the assembly or impairment of its electrical performance. The use of injection potting techniques squeezes the size of the voids in the plastic potting material to a minimum, thereby eliminating breakage of leads due to movement of the components into the voids upon setback. The construction is thus particularly rugged and provides maximum resistance to impact and vibration.

It is not intended that the invention be limited to the exact shape of the component holder casing 10 or to the number or size of component holding pockets therein as disclosed in the preferred embodiment of the invention. The component holder of the invention is adaptable to the support of any electronic circuit components that are small and approximately cylindrical in shape.

Having thus described my invention, what I claim as new and desire to secure by Letters Patent of the United States is:

1. A component holder for supporting small, approximately cylindrical, pigtail-lead, electronic circuit components such as resistors, tubular condensers, choke coils and radio tubes, comprising a one-piece, molded elastically-deformable plastic casing honeycombed with a plurality of parallel, substantially cylindrical, vertical component holding pockets open at the top and being only partially closed at the bottom by an inwardly extending shoulder adapted to support a component thereon and to fit the end of the component, the diameter of the pockets being slightly smaller than the diameter of the components, the diameter at said shoulder being sufficient to allow the passage of a pigtail lead from the component.

2. A component holder for supporting small, approximately cylindrical pigtail-lead, electronic circuit components such as resistors, tubular condensers, choke coils and subminiature radio tubes, comprising a one-piece, molded, elastically-deformable plastic casing honeycombed with a plurality of parallel, substantially cylindrical, vertical, component holding pockets open at the top and having an aperture through the bottom wall thereof, said bottom wall being adapted to support an electronic component and to fit the end of the component with the bottom wall of some of said pockets adapted to snugly receive the approximately conical and pointed exhaust tip of said subminiature radio tubes, the diameter of the pockets being slightly smaller than the diameter of the components, the diameter of said aperture being sufficient to allow the passage of a pigtail lead from the component.

3. A component holder for supporting small, approximately cylindrical, pigtail-lead, electronic circuit components such as resistors, tubular condensers, choke coils and radio tubes, comprising a one-piece, molded, elastically-deformable and shock-resistant plastic casing honeycombed with a plurality of parallel, substantially cylindrical, vertical, component holding pockets open at the top and having a central aperture through the bottom wall of the pockets of sufficient diameter to allow the passage of a pigtail lead from a component, said bottom wall being adapted to support an electronic component and to fit the end of the component, the diameter of the pockets being slightly smaller than the diameter of the components, said casing also having a plurality of small diameter apertures extending completely therethrough.

4. A component holder for supporting small, approximately cylindrical pigtail-lead, electronic circuit components such as resistors, tubular condensers, choke coils and radio tubes, comprising a one-piece, molded, resilient plastic casing honeycombed with a plurality of parallel, substantially cylindrical, vertical, component holding pockets open at the top and having an aperture through the bottom wall thereof, said bottom wall being adapted to support an electronic component and to fit the end of the component, components in said pockets, each of said components having a diameter slightly larger than its respective pocket whereby the component is resiliently held in said pocket.

References Cited in the file of this patent

FOREIGN PATENTS 671,156 France ---------------- Oct. 31, 1929
144,122 Switzerland ------------ Dec. 15, 1930